(12) United States Patent
Liu et al.

(10) Patent No.: US 11,939,669 B2
(45) Date of Patent: Mar. 26, 2024

(54) COATING METHOD FOR CONTINUOUS PREPARATION OF DIAMOND THIN FILM WITH HFCVD DEVICE

(71) Applicant: Institute of Metal Research Chinese Academy of Sciences, Shenyang (CN)

(72) Inventors: Lusheng Liu, Shenyang (CN); Xin Jiang, Shenyang (CN); Nan Huang, Shenyang (CN)

(*) Notice: Subject to any disclaimer, the term of this patent is extended or adjusted under 35 U.S.C. 154(b) by 19 days.

(21) Appl. No.: 17/627,754

(22) PCT Filed: Nov. 26, 2019

(86) PCT No.: PCT/CN2019/120849
§ 371 (c)(1),
(2) Date: Jan. 17, 2022

(87) PCT Pub. No.: WO2021/008057
PCT Pub. Date: Jan. 21, 2021

(65) Prior Publication Data
US 2022/0316053 A1    Oct. 6, 2022

(30) Foreign Application Priority Data
Jul. 18, 2019 (CN) .......................... 201910652012.5

(51) Int. Cl.
*C23C 16/27* (2006.01)
*C23C 16/458* (2006.01)
(Continued)

(52) U.S. Cl.
CPC ........ *C23C 16/271* (2013.01); *C23C 16/4587* (2013.01); *C23C 16/52* (2013.01); *C23C 16/54* (2013.01)

(58) Field of Classification Search
CPC ... C23C 16/271; C23C 16/4587; C23C 16/52; C23C 16/54
See application file for complete search history.

(56) References Cited

U.S. PATENT DOCUMENTS 5,160,544 A * 11/1992 Garg ..................... C23C 16/271
                                                118/724
5,372,648 A * 12/1994 Yamamoto .......... C23C 16/4401
                                                118/725
(Continued)

FOREIGN PATENT DOCUMENTS

EP       0589641 A2 *  3/1994  ............. C23C 16/26
KR    10-1932578      * 12/2018  ........... H01L 21/205

OTHER PUBLICATIONS

Abreu, C.S., et al., "HFCVD nanocrystalline diamond coatings for tribo-applications in the presence of water". Diamond and Related Materials 18 (2009) 271-275.*
(Continued)

*Primary Examiner* — Bret P Chen
(74) *Attorney, Agent, or Firm* — Novoclaims Patent Services LLC; Mei Lin Wong

(57) ABSTRACT

A coating method for preparing diamond thin film continuously by HFCVD device includes the steps of: (a) carbonizing left and right chamber hot filaments; (b) disposing a substrate on a platform along with a trolley in a sample access chamber under vacuum condition; opening a left chamber gate valve and moving the substrate to left thin film growth chamber; closing the left chamber gate valve to grow diamond thin film on the substrate; (c) repeating step (b) by using a right chamber gate valve and right thin film growth chamber to grow diamond thin film; (d) opening the left chamber gate valve and moving the substrate to the sample access chamber; closing the left chamber gate valve and dropping to room temperature while under vacuum condition; releasing the vacuum condition and taking out the substrate with diamond thin film; (e) repeating step (d) for the right chamber gate valve.

18 Claims, 3 Drawing Sheets

(51) Int. Cl.
*C23C 16/52* (2006.01)
*C23C 16/54* (2006.01)

(56) References Cited

U.S. PATENT DOCUMENTS

| | | | | |
|---|---|---|---|---|
| 5,445,106 | A * | 8/1995 | Einset | C23C 16/279 |
| | | | | 117/1 |
| 6,054,183 | A * | 4/2000 | Zimmer | C23C 16/27 |
| | | | | 427/249.11 |
| 6,558,742 | B1 * | 5/2003 | Tzeng | C23C 16/277 |
| | | | | 427/249.11 |
| 10,847,365 | B2 * | 11/2020 | Fukazawa | H01L 21/0228 |
| 2004/0216673 | A1 * | 11/2004 | Sakata | C23C 14/56 |
| | | | | 118/719 |
| 2009/0017258 | A1 * | 1/2009 | Carlisle | C23C 16/271 |
| | | | | 427/249.8 |
| 2010/0064538 | A1 * | 3/2010 | Scarsbrook | B23K 26/38 |
| | | | | 428/141 |
| 2011/0045349 | A1 * | 2/2011 | Pushparaj | H01G 11/10 |
| | | | | 427/78 |
| 2011/0086496 | A1 * | 4/2011 | Jin | C23C 16/303 |
| | | | | 257/E21.09 |
| 2013/0109161 | A1 * | 5/2013 | Jin | C30B 29/403 |
| | | | | 438/505 |
| 2018/0021912 | A1 * | 1/2018 | Shimamura | B24B 21/00 |
| | | | | 451/41 |

OTHER PUBLICATIONS

Barletta, M., et al., "Chemical Vapor Deposition of Highly Adherent Diamond Coatings onto Co-Cemented Tungsten Carbides Irradiated by High Power Diode Laser". ACS Applied Materials & Interfaces, 2012, 4, 694-701.*

Wang, Xinchang, et al., "Comparisons of HFCVD diamond nucleation and growth using different carbon sources". Diamond and Related Materials 54 (2015) 26-33.*

Lai, Guan-Ren, et al., "Deposition of Diamond Films in a Closed Hot Filament CVD System". Journal of Research of the National Institute of Standards and Technology. vol. 100, No. 1, Jan--Feb. 1995, pp. 43-49.*

* cited by examiner

COATING METHOD FOR CONTINUOUS PREPARATION OF DIAMOND THIN FILM WITH HFCVD DEVICE

CROSS REFERENCE OF RELATED APPLICATION

This is a non-provisional National Stage entry under 35 USC 371 of a PCT international application number PCT/CN2019/120849, international filing date Nov. 26, 2019, which claimed priority to a foreign application number 201910652012.5 filed on Jul. 18, 2019 in China (CN), the entire contents of each of which are expressly incorporated herein by reference.

FIELD OF INVENTION

The present invention relates to a field of diamond film growth, and more particularly to a HFCVD device used for continuous preparation of a diamond thin film and a coating method thereof.

DESCRIPTION OF RELATED ARTS

Diamond has excellent properties such as force, heat, sound, light, electricity, and chemical properties. The performance of synthetic diamond film is basically close to that of natural diamond, wherein the synthetic diamond with its excellent performance has a wide range of applications in the high-tech field. Currently, diamond thin film technology has been applied in many applications such as cutting tools, high-performance electronic components, aerospace materials, etc., and it has received several results, and its application in the high-tech field has drawn people's attention. Chemical Vapor Deposition (CVD) diamond film is known as the most promising new coating material in the 21' century because of its high hardness, high thermal conductivity, low friction coefficient and low thermal expansion coefficient of natural diamond. Currently, Hot Filament Chemical Vapor Deposition (HFCVD) diamond film preparation method is the main preparation method of industrial CVD diamond film. This method has relatively simple operation and low cost, and is easy to control the temperature of the substrate, wherein this method is able to obtain a diamond film with high quality and large area.

However, the existing preparation method has the following drawbacks.

1. The hot filament of the existing HFCVD device is mostly disposed in a horizontal manner, wherein the physical changes of the hot filament caused by its thermal expansion and gravity will affect the distance from the hot filament to the surface of the substrate to affects the deposition temperature on the surface of the substrate, such that uneven film is formed, and the hot filament is fragile after carbonization.

2. The existing HFCVD device usually uses an initial installation of hot filament for vacuum, carbonization, coating, cooling down, vacuum breaking, and substrate take out, and then a reinstallation of hot filament for re-vacuum, carbonization, coating, cooling down, vacuum breaking, and substrate take out. Therefore, the continuous preparation of CVD diamond film cannot be provided, the production cost is high, and the preparation efficiency is low.

3. The hot filaments of the existing HFCVD device are mostly monofilament single-sided coating, wherein the coating area on the other side of the hot filament is empty, such that the coating efficiency is low.

4. The existing HFCVD device requires more than one coating room or one coating room with one sampling room, such that the production cycle is slow and the coating efficiency is low.

SUMMARY OF THE PRESENT INVENTION

The invention is advantageous in that it provides a HFCVD device used for continuous preparation of a diamond thin film and a coating method thereof, which can solve the existing problems of the prior art including uneven thickness of the film, the fragility of the hot filament after carbonization, and low coating efficiency.

The technical solution of present invention provides:

A HFCVD device used for continuous preparation of a diamond thin film, wherein the device comprises a left chamber gate valve, a left thin film growth chamber, a left chamber water-cooled electrode, two left chamber hot filament racks, two or more left chamber hot filaments, a left chamber drive roller, a left chamber support frame, a sample access chamber support frame, a right chamber support frame, a right chamber drive roller, two or more right chamber hot filaments, two right chamber hot filament racks, a right chamber water-cooled electrode, a right thin film growth chamber, a right chamber gate valve, a sample loading chamber drive roller, a sample access chamber, a substrate, a substrate platform, and a substrate trolley, wherein the specific structures are as follows:

The sample access chamber is located at a center of the device. The substrate trolley is disposed in the sample access chamber. The substrate platform is disposed on the substrate trolley. The substrate is arranged on the substrate platform.

A left side of the sample access chamber is communicatively connected to the left thin film growth chamber through the left chamber gate valve. The left chamber water-cooled electrode, the left chamber hot filament rack, the left chamber hot filament, and the left chamber drive roller are orderly arranged in the left thin film growth chamber from top to bottom. The two left chamber hot filament racks are arranged in parallel and provided as an upper left chamber hot filament rack and a lower left chamber hot filament rack. The left chamber hot filaments are provided and arranged in parallel, wherein the two chamber hot filaments are perpendicularly extended between the two left chamber hot filament racks. The left chamber water-cooled electrode is connected to the left chamber hot filament racks. The left chamber drive roller is coupled at a bottom of the left thin film growth chamber.

A right side of the sample access chamber is communicatively connected to the right thin film growth chamber through the right chamber gate valve. The right chamber water-cooled electrode, the right chamber hot filament rack, the right chamber hot filament, and the right chamber drive roller are orderly arranged in the right thin film growth chamber from top to bottom. The two right chamber hot filament racks are arranged in parallel and provided as an upper right chamber hot filament rack and a lower right chamber hot filament rack. The right chamber hot filaments are provided and arranged in parallel, wherein the right chamber hot filaments are perpendicularly extended between the two right chamber hot filament racks. The right chamber water-cooled electrode is connected to the right chamber hot filament rack. The right chamber drive roller is coupled at a bottom of the right thin film growth chamber.

According to the HFCVD device used for continuous preparation of a diamond thin film, the sample access chamber support frame is provided below a bottom of the sample access chamber.

According to the HFCVD device used for continuous preparation of a diamond thin film, it further comprises a left chamber observation window formed at a top of the left thin film growth chamber, wherein the left chamber support frame is provided below a bottom of the left thin film growth chamber.

According to the HFCVD device used for continuous preparation of a diamond thin film, it further comprises a right chamber observation window formed at a top of the right thin film growth chamber, wherein the right chamber support frame is provided below a bottom of the right thin film growth chamber.

According to the HFCVD device used for continuous preparation of a diamond thin film, it further comprises an electric control system, a vacuuming system, and a gas system sequentially arranged on one side of the sample access chamber, the left thin film growth chamber and the right thin film growth chamber respectively.

According to the HFCVD device used for continuous preparation of a diamond thin film, an output end of the electric control system is operatively connected to the left chamber water-cooled electrode, the right chamber water-cooled electrode, the substrate trolley, the vacuuming system, and the gas system, etc. via cables respectively. The vacuuming system is operatively connected to the sample access chamber, the left thin film growth chamber, the right thin film growth chamber, the left chamber gate valve, and the right chamber gate valve respectively via a vacuum pipeline configuration.

According to the HFCVD device used for continuous preparation of a diamond thin film, it further comprises two heat shields, wherein the left chamber drive roller, the sample loading chamber drive roller, and the right chamber drive roller are successively aligned in a row manner to form a transportation channel alignedly matching with the substrate trolley, wherein two of the substrate platforms are arranged in parallel with each other and are provided on the substrate trolley, wherein the substrate is disposed on each of the substrate platforms, wherein the heat shields are vertically supported at two inner walls of the sample access chamber respectively, wherein the substrate trolley is located between the two heat shields.

According to the HFCVD device used for continuous preparation of a diamond thin film, wherein after the substrate trolley enters into the left thin film growth chamber or the right thin film growth chamber, the two substrates in a parallel manner are evenly distributed on two sides of the left chamber hot filament or the right chamber hot filament.

According to the HFCVD device used for continuous preparation of a diamond thin film, wherein the sample access chamber, the left thin film growth chamber, and the right thin film growth chamber are respectively formed in rectangular shape with double-wall water-cooled structure, and are made of SUS304 material.

The coating method of the HFCVD device used in the continuous preparation of the diamond thin film comprises the following steps.

Step (1): Close the left chamber gate valve and the right chamber gate valve, controllably vacuum the left thin film growth chamber and the right thin film growth chamber to reach a predetermined pressure within 20 Pa through the vacuuming system, heat up the left chamber hot filament and the right chamber hot filament in a range between 2000° C. and 3000° C., and activate the gas system to fill reaction gas to the left thin film growth chamber and the right thin film growth chamber respectively so as to carbonize the left chamber hot filament and the right chamber hot filament.

Step (2): Dispose the substrate, which is pre-cleaned, on the substrate platform, place the substrate trolley along with the substrate and the substrate platform in the sample access chamber, and vacuum the sample access chamber at a predetermined pressure within 20 Pa.

Step (3): Open the left chamber gate valve.

Step (4): Actuate the sample loading chamber drive roller and the left chamber drive roller to move the substrate trolley to the left thin film growth chamber.

Step (5): Close the left chamber gate valve and start to grow the diamond thin film on the substrate.

Step (6): Dispose the substrate, which is pre-cleaned, on the substrate platform, place the substrate trolley along with the substrate and the substrate platform in the sample access chamber, and vacuum the sample access chamber at a predetermined pressure within 20 Pa.

Step (7): Open the right chamber gate valve.

Step (8): Actuate the sample loading chamber drive roller and the right chamber drive roller to move the substrate trolley to the right thin film growth chamber.

Step (9): Close the right chamber gate valve and start to grow the diamond thin film on the substrate.

Step (10): After the growth of the diamond thin film on the substrate in the left thin film growth chamber is completed, open the left chamber gate valve and actuate the left chamber drive roller and the sample loading chamber drive roller to move the substrate trolley to the sample access chamber.

Step (11): Close the left chamber gate valve.

Step (12): Drop the temperature of the substrate to room temperature while maintain the sample access chamber in a vacuum manner.

Step (13): Release the vacuum of the sample access chamber and take out the substrate with the diamond thin film being grown thereon.

Step (14): Dispose the substrate, which is pre-cleaned, on the substrate platform, place the substrate trolley along with the substrate and the substrate platform in the sample access chamber, and vacuum the sample access chamber at a predetermined pressure within 20 Pa.

Step (15): Open the left chamber gate valve.

Step (16): Actuate the sample loading chamber drive roller and the left chamber drive roller to move the substrate trolley to the left thin film growth chamber.

Step (17): Close the left chamber gate valve.

Step (18): After the growth of the diamond thin film on the substrate in the right thin film growth chamber is completed, open the right chamber gate valve.

Step (19): Actuate the right chamber drive roller and the sample loading chamber drive roller to move the substrate trolley to the sample access chamber.

Step (20): Close the right chamber gate valve.

Step (21): Drop the temperature of the substrate to room temperature while maintain the sample access chamber in a vacuum manner.

Then, return to the Step (6) to start the cycle again.

The present invention has the following advantages and beneficial effects:

1. According to the present invention, the hot filament can be configured in a vertical layout and will not be bend or deform during the heating and coating processes, wherein the hot filament is stably retained to keep a certain distance from the substrate, so as to improve the coating quality and enhance the uniformity of the diamond film.

2. According to the present invention, under the unchanged working conditions of the left and right thin film growth chambers, the substrate on the substrate platform is alternately transferred to the left and right thin film growth chambers via the substrate trolley for the continuous preparation of diamond thin film, to avoid any breakage of the hot filament after carbonization. The device is able to continuously use, to reduce filament consumption, to reduce auxiliary times for reinstalling the filament, vacuuming, carbonizing the filament, and filling the vacuum chamber, and to greatly improve the production efficiency of diamond thin film.

3. According to the present invention, the two substrates in a parallel manner are provided on the substrate trolley, wherein after the substrate trolley 21 enters the thin film growth chambers, the two substrates are evenly distributed on two sides of the hot filaments to enlarge the coating area at double sides thereof and to improve the coating efficiency while being cost effective.

4. According to the present invention, by controlling the coating cycle process, one sample access chamber is configured corresponding to two thin film growth chambers to ensure the substrate directly entering into the sample access chamber from the high temperature zone of the thin film growth chamber after the substrate is coated, such that the substrate is slowly cooled down in a vacuum condition to effectively eliminate the stress between the diamond thin film and the substrate and to improve the bonding force between the diamond thin film and the substrate. Meanwhile, another substrate is continuously coated in another thin film growth chamber to improve production efficiency.

In the figure: 1—left chamber gate valve, 2—left thin film growth chamber, 3—left chamber water-cooled electrode, 4—left chamber hot filament rack, 5—left chamber hot filament 5, 6—left chamber drive roller, 7—left chamber support frame, 8—sample access chamber support frame, 9—left chamber support frame, 10—right chamber drive roller, 11—right chamber hot filament, 12—right chamber hot filament rack, 13—right chamber water-cooled electrode, 14—right thin film growth chamber, 15—right chamber gate valve, 16—sample loading chamber drive roller, 17—heat shield 17, 18—sample access chamber 18.

Figure 2:
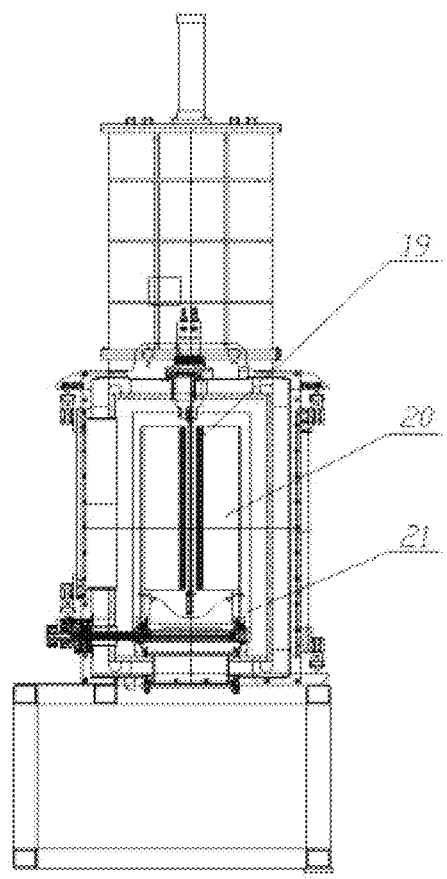

FIG. 2 is a side sectional view of the HFCVD device according to the above preferred embodiment of the present invention.

In the figure: 19—substrate, 20—substrate platform, 21—substrate trolley.

Figure 3:
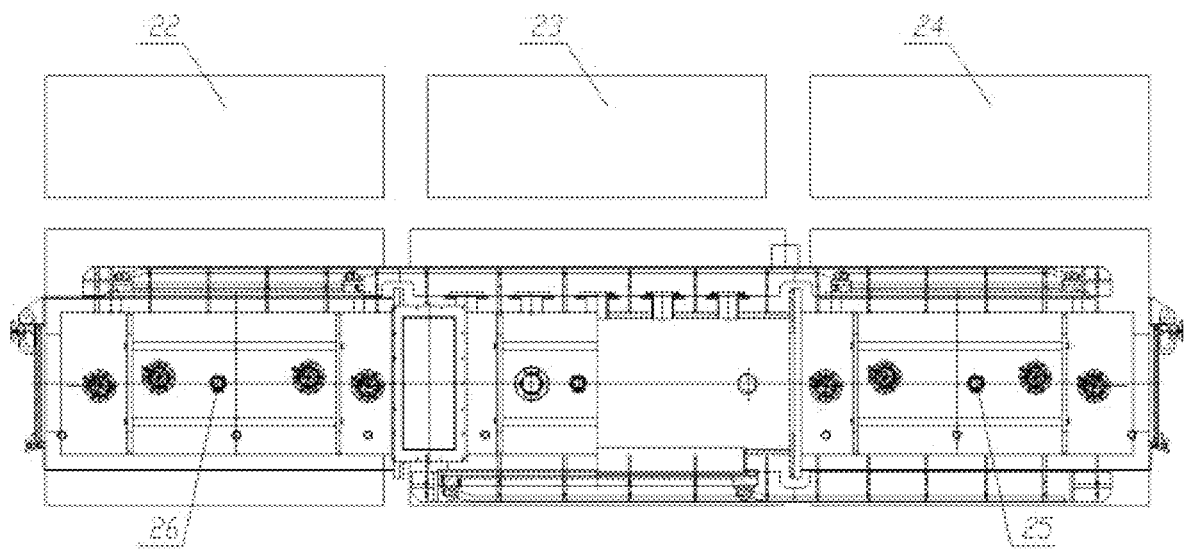

FIG. 3 is a top view of the HFCVD device according to the above preferred embodiment of the present invention.

In the figure: 22—electric control system, 23—vacuuming system, 24—gas system, 25—right chamber observation window, 26—left chamber observation window.

Figure 4:
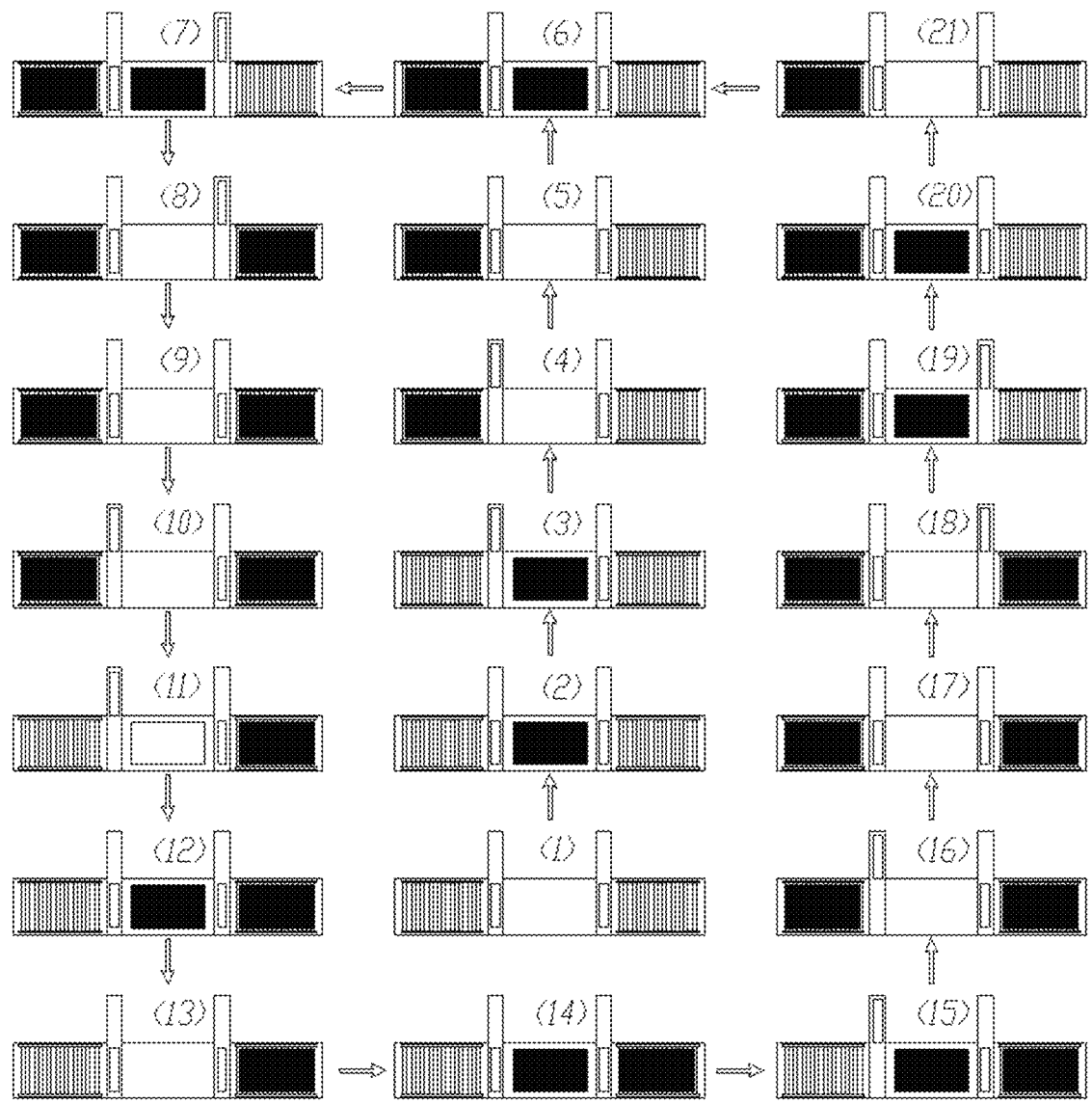

FIG. 4 is a flow chart of a continuous film growth according to the above preferred embodiment of the present invention.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Figure 1:
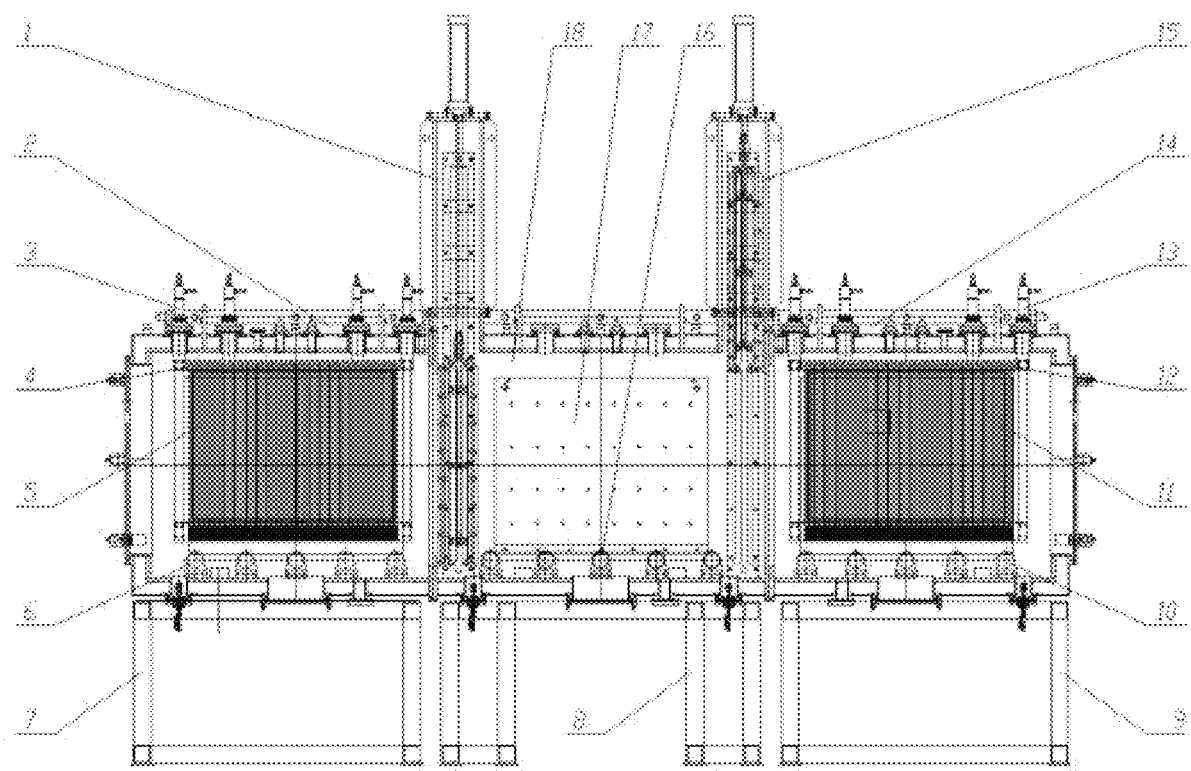
FIG. 1 is a front sectional view of a HFCVD device according to a preferred embodiment of the present invention.

Referring to FIG. 1, FIG. 2 and FIG. 3, the diamond thin film continuous preparation HFCVD device of the present invention comprises a left chamber gate valve 1, a left thin film growth chamber 2, a left chamber water-cooled electrode 3, a left chamber hot filament rack 4, a left chamber hot filament 5, a left chamber drive roller 6, a left chamber support frame 7, a sample access chamber support frame 8, a right chamber support frame 9, a right chamber drive roller 10, a right chamber hot filament 11, a right chamber hot filament rack 12, a right chamber water-cooled electrode 13, a right thin film growth chamber 14, a right chamber gate valve 15, a sample loading chamber drive roller 16, a heat shield 17, a sample access chamber 18, a substrate 19 (sample), a substrate platform 20, a substrate trolley 21, a substrate platform 20, a substrate trolley 21, an electric control system 22, a vacuuming system 23, a gas system 24, a right chamber observation window 25, and a left chamber observation window 26.

The sample access chamber 18 is located at a center of the device as one example according to the present invention. The heat shield 17 and the substrate trolley 21 are disposed in the sample access chamber 18. Preferably, two heat shields 17 are vertically supported at two opposed inner walls of the sample access chamber 18, wherein the substrate trolley 21 is located between the two heat shields 17. The substrate platform 20 is disposed on the substrate trolley 21. The substrate 18 is arranged on the substrate platform 20. The sample access chamber support frame 8 is provided below a bottom of the sample access chamber 18.

A left side of the sample access chamber 18 is communicatively connected to the left thin film growth chamber 2 through the left chamber gate valve 1. The left chamber observation window 26, the left chamber water-cooled electrode 3, the left chamber hot filament rack 4, the left chamber hot filament 5, and the left chamber drive roller 6 are orderly arranged in the left thin film growth chamber 2 from top to bottom. Preferably, two left chamber hot filament racks 4 are arranged in parallel and provided as an upper left chamber hot filament rack and a lower left chamber hot filament rack. Two or more of the left chamber hot filaments 5 are provided and arranged in parallel, wherein the left chamber hot filaments 5 are perpendicularly extended between the two left chamber hot filament racks 4. The left chamber water-cooled electrode 3 is connected to the left chamber hot filament rack 4. The left chamber drive roller 6 is coupled at a bottom of the left thin film growth chamber 2. The left chamber observation window 26 is formed in the left thin film growth chamber 2 at a top-center location thereof, wherein the left chamber observation window 26 is embedded in an upper casing of the left thin film growth chamber 2 by welding. The left chamber support frame 7 is disposed below the bottom of the left thin film growth chamber 2.

A right side of the sample access chamber 18 is communicatively connected to the right thin film growth chamber 14 through the right chamber gate valve 15. The right chamber observation window 25, the right chamber water-cooled electrode 13, the right chamber hot filament rack 12, the right chamber hot filament 11, and the right chamber drive roller 10 are orderly arranged in right left thin film growth chamber 14 from top to bottom. The right chamber hot filament racks 12 are arranged in parallel and provided as an upper right chamber hot filament rack and a lower right chamber hot filament rack. Two or more of the right chamber hot filaments 11 are provided and arranged in parallel, wherein the right chamber hot filaments 11 are perpendicularly extended between the two right chamber hot filament racks 12. The right chamber water-cooled electrode 13 is connected to the right chamber hot filament rack 12. The right chamber drive roller 10 is coupled at a bottom of the right thin film growth chamber 14. The right chamber observation window 25 is formed in the right thin film growth chamber 14 at a top-center location thereof, wherein the right chamber observation window 25 is embedded in an upper casing of the right thin film growth chamber 14 by welding. The right chamber support frame 9 is disposed below the bottom of the right thin film growth chamber 14.

Furthermore, the electric control system 22, the vacuuming system 23, the gas system 24 are sequentially arranged on one side of the sample access chamber 18, the left thin film growth chamber 2 and the right thin film growth chamber 14 respectively, wherein an output end of the electric control system 22 is operatively connected to the left chamber water-cooled electrode 3, the right chamber water-cooled electrode 13, the substrate trolley 21, the vacuuming system 23, and the gas system 24, etc. via cables. A control process of the device is that: The vacuuming system 23 is operatively connected to the sample access chamber 18, the left thin film growth chamber 2, the right thin film growth chamber 14, the left chamber gate valve 1, and the right chamber gate valve 15 respectively via a vacuum pipeline configuration in order to vacuum the sample access chamber 18, the left thin film growth chamber 2, the right thin film growth chamber 14, the left chamber gate valve 1, and the right chamber gate valve 15 respectively. The gas system 24 is operatively connected to the left thin film growth chamber 2 and the right thin film growth chamber 14 respectively via a gas pipeline configuration in order to accurately inject various reaction gases into the left thin film growth chamber 2 and the right thin film growth chamber 14 respectively.

The left chamber drive roller 6, the sample loading chamber drive roller 16, and the right chamber drive roller 10 are successively aligned in a row manner to form a transportation channel alignedly matching with the substrate trolley 21. Two of the substrate platforms 20 are arranged in parallel with each other and are provided on the substrate trolley 21, wherein the heat shields 17 in the sample access chamber 18 are vertically supported between the substrate trolley 21 and the inner wall of the sample access chamber 18. The function of the heat shields 17 is to effectively insulate the substrate trolley 21 at a relatively high temperature delivered from the thin film growth chambers (the left thin film growth chamber 2, the right thin film growth chamber 14), so as to avoid any direct heat radiating to the inner walls of the sample access chamber 18 to drop the temperature of the substrate trolley 21. After the substrate trolley 21 enters the thin film growth chambers (the left thin film growth chamber 2, the right thin film growth chamber 14), the two substrates 19 in a parallel manner are evenly distributed on two sides of the hot filaments (the left chamber hot filament 5 or the right chamber hot filament 11) to enlarge the coating area at double sides thereof and to improve the coating efficiency while being cost effective.

The sample access chamber 18, the left thin film growth chamber 2, and the right thin film growth chamber 14 are respectively formed in rectangular shape with double-wall water-cooled structure, and are made of SUS304 material. The double-wall water-cooled structure refers to: the casing is constructed to have an upper casing and a lower casing to form a hollow cavity between the upper and lower casings, wherein cooling water is filled and circulated in the hollow cavity.

Hereinafter, the present invention will be further described in detail through the embodiment.

EMBODIMENT

As shown in FIG. 4, the coating method of the HFCVD device used in the continuous preparation of the diamond thin film according to the preferred embodiment comprises the following steps.

Step (1): Close the left chamber gate valve 1 and the right chamber gate valve 15, controllably vacuum the left thin film growth chamber 2 and the right thin film growth chamber 14 to reach a predetermined pressure within 20 Pa through the vacuuming system 23, heat up the left chamber hot filament 5 and the right chamber hot filament 11 to 2400° C., and activate the gas system 24 to fill reaction gas to the left thin film growth chamber 2 and the right thin film growth chamber 14 respectively so as to carbonize the left chamber hot filament 5 and the right chamber hot filament 11.

Step (2): Dispose the substrate 19, which is pre-cleaned, on the substrate platform 20, place the substrate trolley 21 along with the substrate 19 and the substrate platform 20 in the sample access chamber 18, and vacuum the sample access chamber 18 at a predetermined pressure within 20 Pa.

Step (3): Open the left chamber gate valve 1.

Step (4): Actuate the sample loading chamber drive roller 16 and the left chamber drive roller 6 to move the substrate trolley 21 to the left thin film growth chamber 2.

Step (5): Close the left chamber gate valve 1 and start to grow the diamond thin film on the substrate 19.

Step (6): Dispose the substrate 19, which is pre-cleaned, on the substrate platform 20, place the substrate trolley 21 along with the substrate 19 and the substrate platform 20 in the sample access chamber 18, and vacuum the sample access chamber 18 at a predetermined pressure within 20 Pa.

Step (7): Open the right chamber gate valve 15.

Step (8): Actuate the sample loading chamber drive roller 16 and the right chamber drive roller 10 to move the substrate trolley 21 to the right thin film growth chamber 14.

Step (9): Close the right chamber gate valve 15 and start to grow the diamond thin film on the substrate 19.

Step (10): After the growth of the diamond thin film on the substrate 19 in the left thin film growth chamber 2 is completed, open the left chamber gate valve 1 and actuate the left chamber drive roller 6 and the sample loading chamber drive roller 16 to move the substrate trolley 21 to the sample access chamber 18.

Step (11): Close the left chamber gate valve 1.

Step (12): Drop the temperature of the substrate 19 to room temperature while maintain the sample access chamber 18 in a vacuum manner.

Step (13): Release the vacuum of the sample access chamber 18 and take out the substrate 19 with the diamond thin film being grown thereon.

Step (14): Dispose the substrate 19, which is pre-cleaned, on the substrate platform 20, place the substrate trolley 21 along with the substrate 19 and the substrate platform 20 in the sample access chamber 18, and vacuum the sample access chamber 18 at a predetermined pressure within 20 Pa.

Step (15): Open the left chamber gate valve 1.

Step (16): Actuate the sample loading chamber drive roller 16 and the left chamber drive roller 6 to move the substrate trolley 21 to the left thin film growth chamber 2.

Step (17): Close the left chamber gate valve 1.

Step (18): After the growth of the diamond thin film on the substrate 19 in the right thin film growth chamber 14 is completed, open the right chamber gate valve 15.

Step (19): Actuate the right chamber drive roller 10 and the sample loading chamber drive roller 16 to move the substrate trolley 21 to the sample access chamber 18.

Step (20): Close the right chamber gate valve 15.

Step (21): Drop the temperature of the substrate 19 to room temperature while maintain the sample access chamber 18 in a vacuum manner.

Then, return to the Step (6) to start the cycle again.

According to the results of the preferred embodiment, the present invention can be applied to large-scale industrial production to obtain high practical value.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A coating method for continuous preparation of a diamond thin film by using a HFCVD device, which comprises a left chamber gate valve, a left thin film growth chamber, a left chamber water-cooled electrode, two left chamber hot filament racks, two or more left chamber hot filaments, a left chamber drive roller, a left chamber support frame, a sample access chamber support frame, a right chamber support frame, a right chamber drive roller, two or more right chamber hot filaments, two right chamber hot filament racks, a right chamber water-cooled electrode, a right thin film growth chamber, a right chamber gate valve, a sample loading chamber drive roller, a sample access chamber, a substrate, a substrate platform, a substrate trolley, comprising the steps of:

Step (1): closing said left chamber gate valve and said right chamber gate valve, controlling said left thin film growth chamber and said right thin film growth chamber to reach a predetermined pressure within 20 Pa by vacuuming through a vacuuming system of said HFCVD device, heating up said left chamber hot filaments and said right chamber hot filaments in a range between 2000° C. and 3000° C., and activating a gas system of said HFCVD device to fill reaction gas to said left thin film growth chamber and said right thin film growth chamber respectively so as to carbonize said left chamber hot filaments and said right chamber hot filaments;

step (2): disposing said substrate, which is pre-cleaned, on said substrate platform, place said substrate trolley along with said substrate and said substrate platform in said sample access chamber, and vacuuming said sample access chamber at a predetermined pressure within 20 Pa;

step (3): opening said left chamber gate valve;

step (4): actuating said sample loading chamber drive roller and said left chamber drive roller to move said substrate trolley to said left thin film growth chamber;

step (5): closing said left chamber gate valve and start to grow said diamond thin film on said substrate;

step (6): disposing said substrate, which is pre-cleaned, on said substrate platform, place said substrate trolley along with said substrate and said substrate platform in said sample access chamber, and vacuuming said sample access chamber at a predetermined pressure within 20 Pa to define a vacuum condition;

step (7): opening said right chamber gate valve;

step (8): actuating said sample loading chamber drive roller and said right chamber drive roller to move said substrate trolley to said right thin film growth chamber;

step (9): closing said right chamber gate valve and starting to grow said diamond thin film on said substrate;

step (10): after said growth of said diamond thin film on said substrate in said left thin film growth chamber is completed, opening said left chamber gate valve and actuating said left chamber drive roller and said sample loading chamber drive roller to move said substrate trolley to said sample access chamber;

step (11): closing said left chamber gate valve;

step (12): dropping a temperature of said substrate to room temperature while maintaining said sample access chamber in said vacuum condition;

step (13): releasing said vacuum condition of said sample access chamber and taking out said substrate with said diamond thin film being grown thereon;

step (14): disposing said substrate, which is pre-cleaned, on said substrate platform, placing said substrate trolley along with said substrate and said substrate platform in said sample access chamber, and vacuuming said sample access chamber at a predetermined pressure within 20 Pa to define said vacuum condition;

step (15): opening said left chamber gate valve;

step (16): actuating said sample loading chamber drive roller and said left chamber drive roller to move said substrate trolley to said left thin film growth chamber;

step (17): closing said left chamber gate valve;

step (18): after said growth of said diamond thin film on said substrate in said right thin film growth chamber is completed, opening said right chamber gate valve;

step (19): actuating said right chamber drive roller and said sample loading chamber drive roller to move said substrate trolley to said sample access chamber;

step (20): closing said right chamber gate valve;

step (21): dropping said temperature of said substrate to room temperature while maintaining said sample access chamber in said vacuum condition.

2. The coating method for continuous preparation of a diamond thin film by using said HFCVD device according to claim 1, comprising the steps of:

repeating the step (6) through step (21) to start a subsequent cycle.

3. The coating method for continuous preparation of a diamond thin film by using said HFCVD device according to claim 1, wherein said sample access chamber support frame is provided below a bottom of said sample access chamber.

4. The coating method for continuous preparation of a diamond thin film by using said HFCVD device according to claim 3, further comprising the step of:

repeating the step (6) through step (21) to start a subsequent cycle.

5. The coating method for continuous preparation of a diamond thin film by using said HFCVD device according to claim 1, wherein said HFCVD device further comprises a left chamber observation window formed at a top of said left thin film growth chamber, wherein said left chamber support frame is provided below a bottom of said left thin growth chamber.

6. The coating method for continuous preparation of a diamond thin film by using said HFCVD device according to claim 5, further comprising the step of:
repeating the step (6) through step (21) to start a subsequent cycle.

7. The coating method for continuous preparation of a diamond thin film by using said HFCVD device according to claim 1,
wherein said HFCVD device further comprises a right chamber observation window formed at a top of said right thin film growth chamber, wherein said right chamber support frame is provided below a bottom of said right thin growth chamber.

8. The coating method for continuous preparation of a diamond thin film by using said HFCVD device according to claim 7, further comprising the step of:
repeating the step (6) through step (21) to start a subsequent cycle.

9. The coating method for continuous preparation of a diamond thin film by using said HFCVD device according to claim 1,
wherein said HFCVD device further comprises an electric control system, and said electric control system, said vacuuming system and said gas system are sequentially arranged on one side of said sample access chamber, said left thin film growth chamber and said right thin film growth chamber respectively.

10. The coating method for continuous preparation of a diamond thin film by using said HFCVD device according to claim 9,
wherein said electric control system has an output end operatively connected to said left chamber water-cooled electrode, said right chamber water-cooled electrode, said substrate trolley, said vacuuming system, and said gas system via cables respectively, wherein said vacuuming system is operatively connected to said sample access chamber, said left thin film growth chamber, said right thin film growth chamber, said left chamber gate valve, and said right chamber gate valve respectively via a vacuum pipeline configuration.

11. The coating method for continuous preparation of a diamond thin film by using said HFCVD device according to claim 9, further comprising the step of:
repeating the step (6) through step (21) to start a subsequent cycle.

12. The coating method for continuous preparation of a diamond thin film by using said HFCVD device according to claim 10, further comprising the step of:
repeating the step (6) through step (21) to start a subsequent cycle.

13. The coating method for continuous preparation of a diamond thin film by using said HFCVD device according to claim 1,
wherein said left chamber drive roller, said sample loading chamber drive roller, and said right chamber drive roller are successively aligned in a row manner to form a transportation channel alignedly matching with said substrate trolley, wherein two of said substrate platforms are arranged in parallel with each other and are provided on said substrate trolley, wherein said substrate is disposed on each of the substrate platforms, two heat shields are vertically supported at two inner walls of said sample access chamber respectively, and said substrate trolley is located between said two heat shields.

14. The coating method for continuous preparation of a diamond thin film by using said HFCVD device according to claim 13, further comprising the step of:
repeating the step (6) through step (21) to start a subsequent cycle.

15. The coating method for continuous preparation of a diamond thin film by using said HFCVD device according to claim 1,
wherein after said substrate trolley enters into said left thin film growth chamber or said right thin film growth chamber, said two substrates in a parallel manner are evenly distributed on two sides of said left chamber hot filament or said right chamber hot filament.

16. The coating method for continuous preparation of a diamond thin film by using said HFCVD device according to claim 15, further comprising the step of:
repeating the step (6) through step (21) to start a subsequent cycle.

17. The coating method for continuous preparation of a diamond thin film by using said HFCVD device according to claim 1, wherein said sample access chamber, said left thin film growth chamber, and said right thin film growth chamber are respectively formed in rectangular shape with double-wall water-cooled structure, and are made of SUS304 material.

18. The coating method for continuous preparation of a diamond thin film by using said HFCVD device according to claim 17, further comprising the step of:
repeating the step (6) through step (21) to start a subsequent cycle.

* * * * *